United States Patent
Hsu et al.

(10) Patent No.: US 6,261,906 B1
(45) Date of Patent: Jul. 17, 2001

(54) METHOD FOR FORMING A FLASH MEMORY CELL WITH IMPROVED DRAIN ERASE PERFORMANCE

(75) Inventors: Cheng-Yuan Hsu, Makung; Chih-Ming Chen, Hsinchu, both of (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/365,733

(22) Filed: Aug. 3, 1999

(51) Int. Cl.[7] .................................................. H01L 21/336
(52) U.S. Cl. .......................... 438/266; 438/257; 438/264; 438/265; 438/289
(58) Field of Search .................................... 438/257, 289, 438/262, 263, 264, 265, 266

(56) References Cited

U.S. PATENT DOCUMENTS

| | | | |
|---|---|---|---|
| 5,352,619 | * | 10/1994 | Hong . |
| 5,635,416 | * | 6/1997 | Chen et al. . |
| 5,856,224 | * | 1/1999 | Sheu . |
| 5,963,808 | * | 10/1999 | Lu et al. . |
| 5,981,341 | * | 11/1999 | Kim et al. . |
| 6,133,097 | * | 10/2000 | Hsieh et al. . |
| 6,168,995 | * | 1/2001 | Kelley et al. . |

* cited by examiner

*Primary Examiner*—Charles Bowers
*Assistant Examiner*—Stephen W. Smoot

(57) ABSTRACT

The method for forming a flash memory cell mainly includes the steps as follows. At first, a semiconductor substrate having isolation regions thereon and having a well region provided between the isolation regions is provided. A tunnel oxide layer is formed on the well region and a first silicon layer is formed over the substrate. A dielectric layer is formed on the first silicon layer and a portion of the first silicon layer and the dielectric layer is removed to define a control gate opening within the first silicon layer on a portion of the well region. Next, the substrate is doped in the region under the control gate opening to adjust a threshold voltage of the flash memory cell. A gate oxide layer is grown from the substrate in the control gate opening and a second silicon layer is formed on the substrate to fill within the control gate opening and to cover the remaining dielectric layer. The second silicon layer, the dielectric layer, and the first silicon layer are then patterned to form a gate structure of the flash memory cell, and to leave a drain opening exposing a portion of the tunnel oxide on the well region. Finally, the substrate is doped to form a drain region in the substrate between the gate structure and one of the isolation regions.

19 Claims, 3 Drawing Sheets

METHOD FOR FORMING A FLASH MEMORY CELL WITH IMPROVED DRAIN ERASE PERFORMANCE

FIELD OF THE INVENTION

The present invention relates to semiconductor fabrication processes, and more specifically to a method for forming a flash memory cell with improved drain erasure performance.

BACKGROUND OF THE INVENTION

Memory devices are one of the most important devices for storing of data and information. By storing data electrically in the memory devices, the data can be accessed with ultra high speed for various applications. The progress in memory device fabrication technology has made memory chips become a highly reliable and valuable device for a great amount of data reading and data writing access within an extremely short time. Various types of memories have been developed for a variety of applications like computation and communications systems.

An ideal storage device must have several characteristics. Numerous important applications of memory devices are specified with highly reliable and high speed operations. Low cost is needed for the explosively increasing demand on the more storage capability with a great number of storage units. High performance and high density are both important factors for performing reliable and high speed operations with least volume needed for the storage devices. Low power dissipation are highly demanded for providing longer operation time or greener operations especially for portable devices with limited capacity of power supply. Non-volatile or least refreshing characteristics is needed for both reliable, safety, and low power data storage.

Flash memory has became a valuable choice in the market of portable electrical devices and systems. High density and low power flash memories are required for future portable computer and telecommunication applications. The portable telecommunications and computing market has become a major driving force in semiconductor IC (Integrated Circuits) design and technology. The growing market requires low power, high density, and electrically programmable non-volatile memories, either embedded or stand-alone. Flash memory is another choice other than EEPROM (Electrically Erasable and Programmable ROM) because of its small size and improved reliability. Lots of new concepts and modifications about flash memory have been proposed to improve gate coupling of cells and result in faster data programming and erasure.

FIG. 1 illustrates a conventional split-gate flash memory cell in a cross-sectional view. A tunnel oxide layer 16 is formed on the substrate 2 that is uncovered by isolation regions 12. The split-gate flash memory cell is formed on a substrate 2 having drain junction 4 therein. A control gate 6 is in the flash memory cell and communicates to an edge region of the drain junction 4, or namely the diffused drain region, through a thin silicon oxide region 8. Metal contacts 9a, 9b, and 9c are respectively formed to communicate with the source junction, control gate 6, and drain junction 4.

It is well known in the art that a doped region of silicon material will grow a thicker silicon oxide than undoped one in a thermal oxide growing process. In the conventional process flow of forming the split-gate flash memory cell, a field oxide is grown from the drain junction 4 in the step of thermally growing a thermal gate oxide under the center of the control gate 6. Under the high dose of dopants in the drain junction 4, a much thicker field oxide, which may be grown to as thick as 1000 angstroms, is formed. The field oxide is much thicker than what is expected for the thin silicon oxide region 8 and will significantly damage the operation performance of the flash memory cell.

When the split-gate flash memory cell is in operation, the field oxide, which enlarges the distance between the cell drain diffusion region and the control gate, will lower the erase efficiency of the flash memory cell. Moreover, since the formation of the thick field oxide will extend into the tunnel oxide region with its birds beak effect and damage the tunnel oxide quality, thus leads to cycling issue and reliability problems of the flash memory cell.

SUMMARY OF THE INVENTION

The present invention propose method for forming flash memory device. By the improved process flow and different pattern control in defining respective layers or regions, the flash memory cell is provided with improved drain erase performance. The prior art problem of field oxide under the control gate to damage the data erasure performance is eliminated.

The method for forming a flash memory cell mainly includes the steps as follows. At first, a semiconductor substrate having isolation regions thereon and having a well region provided between the isolation regions is provided. A tunnel oxide layer is formed on the well region and a first silicon layer is formed over the substrate. A dielectric layer is formed on the first silicon layer and a portion of the first silicon layer and the dielectric layer is removed to define a control gate opening within the first silicon layer on a portion of the well region.

Next, the substrate is doped in the region under the control gate opening to adjust a threshold voltage of the flash memory cell. A gate oxide layer is grown from the substrate in the control gate opening and a second silicon layer is formed on the substrate to fill within the control gate opening and to cover on the dielectric layer. The second silicon layer, the dielectric layer, and the first silicon layer are then patterned to form a gate structure of the flash memory cell, and to leave a drain opening exposing a portion of the tunnel oxide on the well region. Finally, the substrate is doped to form a drain region in the substrate between the gate structure and one of the isolation regions.

In the preferred embodiments, the dielectric layer comprises a tri-layer structure of a first silicon oxide layer, a silicon nitride layer, and a second silicon oxide layer. Furthermore, the doping step for forming the drain region in the case includes at least two ion implantation steps to form a double diffused drain structure in the substrate, such as a phosphorus implantation at an energy between about 30 to 50 KeV to have a dose between about 1E14 to 5E14, and an arsenic implantation at an energy between about 40 to 60 KeV to have a dose between about 1E15 to 6E15.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention proposed a method for forming a flash memory device. A floating gate as well as a select gate of the first polysilicon layer can be defined with the self-aligned patterning of defining the control gate of the second polysilicon layer. The doping process for forming a drain region is performed after the growth of a gate oxide. Therefore, the thickness of the silicon oxide region between the control gate and the drain region is well controlled to improve drain erasure performance. The prior art problem of thick field oxide under the control gate to damage the date erasure performance is eliminated.

Figure 1:
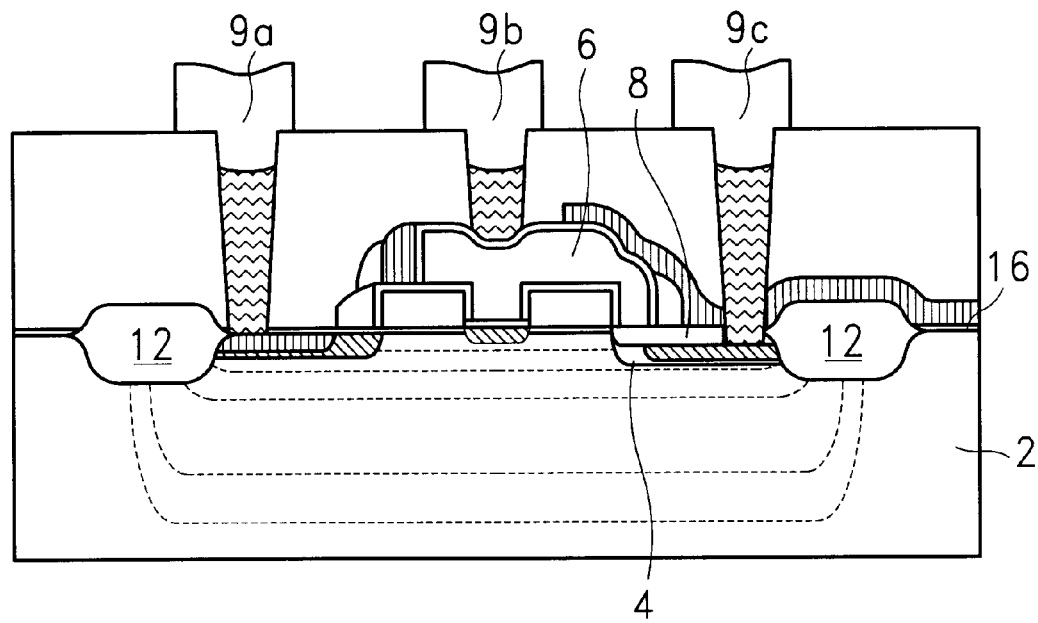
FIG. 1 illustrates a cross sectional view of a split-gate flash memory cell having a thick field oxide under the control gate in the prior art.
Figure 2:
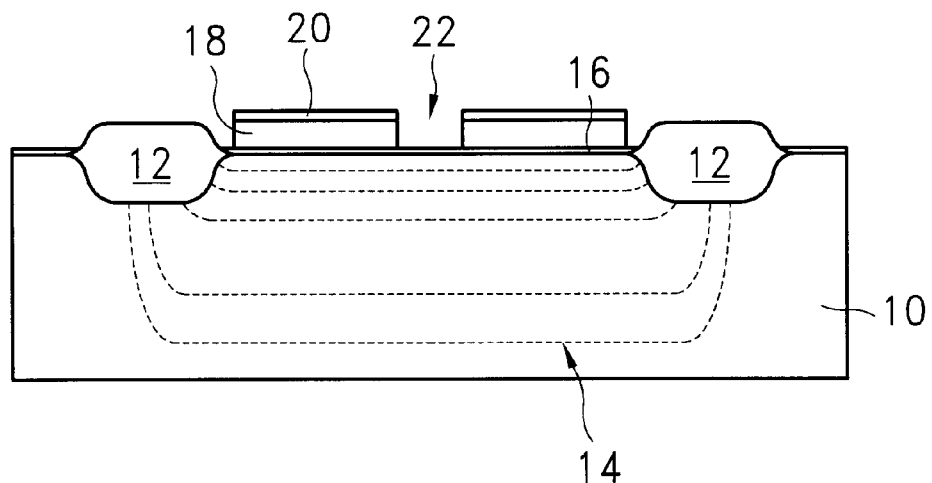
FIG. 2 illustrates a cross sectional view of forming a tunnel oxide and forming and patterning a first silicon layer and a dielectric layer to define a control gate opening within the first silicon layer on a portion of the well region in accordance with the present invention.

Referring to FIG. 2, a semiconductor substrate 10 is illustrated in a cross sectional view. A single crystalline silicon in a <100> direction is utilized preferably as the semiconductor substrate 10. The semiconductor substrate 10 is provided with isolation regions 12 thereon and with a well region 14 in the substrate 10 between the isolation regions 12. In the preferred embodiments, the isolation regions 12 are field oxide (FOX) regions formed on the semiconductor substrate 10.

The formation processes of the FOX regions 12 are as follows. In general, a thin silicon oxide layer is thermally grown on the semiconductor substrate 10 with a thickness in the range of about 50 angstroms to 300 angstroms. A silicon nitride layer is then deposited thereon. The silicon nitride layer is utilized as a layer for inhibiting the FOX growth on an active region of the semiconductor substrate 10.

The silicon nitride layer is then patterned to etch off the regions for forming the FOX. The semiconductor substrate 10 is subjected to a thermal process. As an example, a thermal process performed in a hot steam within an oxygen containing ambient is applied. The regions of the silicon oxide layer uncovered by the silicon nitride layer is grown to become the FOX regions 12 to serve as the isolation regions shown in FIG. 2. The pad oxide layer and the nitride layer formed on a regions other than the FOX regions 12 are then removed. The isolation regions on the semiconductor substrate 10 can be created through other isolation technologies which are well known in the art, like the trench isolation and so on, with the same purpose in splitting respective active regions or memory cells.

A tunnel oxide layer 16 is then formed on the well region 14. In the preferred embodiments, the tunnel oxide 16 is thermally grown from the substrate 10 in an oxygen containing ambient, with a thickness between about 30 to 180 angstroms. After the formation of the tunnel oxide layer 16, a first silicon layer 18 is formed over the substrate 10 to cover on the tunnel oxide layer 16. In the case, the first silicon layer 18 is preferably a polysilicon layer. The polysilicon layer can be formed by chemical vapor deposition (CVD) with a thickness, as an example, between about 1200 to 3000 angstroms.

Next, a dielectric layer 20 is formed on the first silicon layer 18. In the preferred embodiments, the dielectric layer 20, which serves as the major dielectric between a floating gate/a select gate and a control gate, is a tri-layer structure of a first silicon oxide layer, a silicon nitride layer, and a second silicon oxide layer. The stacked three layer structure formed preferably by chemical vapor deposition (CVD) generally provides improved operational characteristics for the flash memory cell device.

A patterning process is then carried out to remove a portion of the first silicon layer 18 and the dielectric layer 20 to define a control gate opening 22 within the first silicon layer 18 on a portion of the well region 14, such as on the center area of the well region 14 as shown in FIG. 2. Typical patterning process can be employed to form the control gate opening 22. A lithography process is performed first to define the specified location and a series of etching processes like an isotropic etching, or more specifically a plasma etching or a reactive ion etching (RIE), are applied then to define the control gate opening 22. In the preferred embodiments, the first silicon layer 18 is patterned in a way such that, the remaining first silicon layer still covers most of the well region, namely the region between the isolation regions 12, except for the region defined by the control gate opening 22, as illustrated in FIG. 2.

Figure 3:
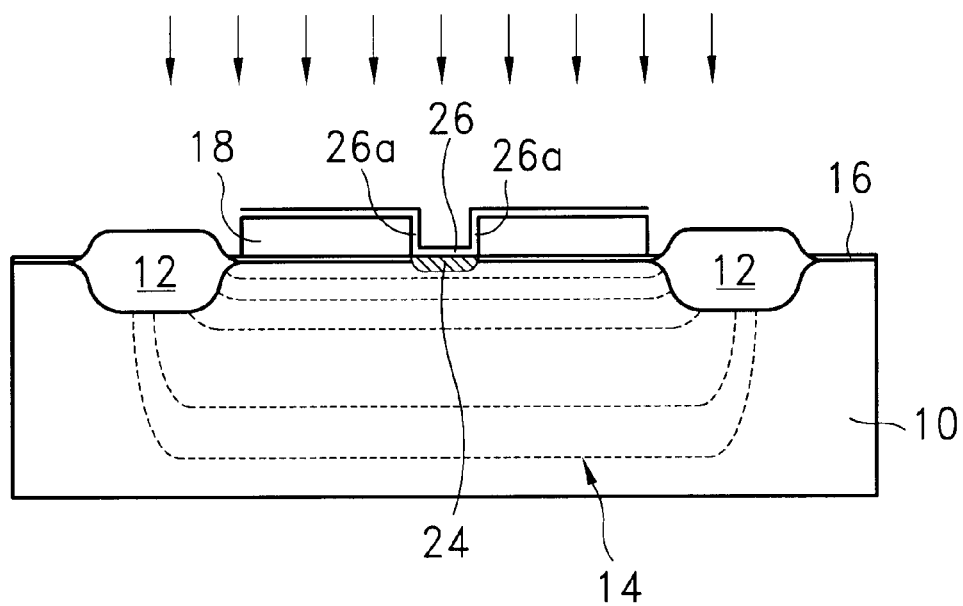
FIG. 3 illustrates a cross sectional view of doping the substrate under the control gate opening and growing a gate oxide layer from the substrate in the control gate opening in accordance with the present invention.

Turning to FIG. 3, after the control gate opening 22 is opened, the substrate 10 is doped in the region under the control gate opening 22 to adjust a threshold voltage of the flash memory cell. In the case, the doping of the substrate 10 to adjust the threshold voltage is performed with an ion implantation of n-type dopants at an energy between about 20 to 80 KeV to have a dose in the doped region 24 between about 5E11 to 1E13 atoms/cm$^2$. A gate oxide layer 26 is grown from the substrate 10 in the control gate opening. As an example, the thickness of the gate oxide layer 26 is about 100 to 350 angstroms in the case. A typical thermal oxidation process can be performed to form the gate oxide layer 26 from the substrate. In the thermal oxidation process, other than the formation of the gate oxide 26, a sidewall silicon oxide 26a is also grown on sidewalls of the first silicon layer 18 by the thermal oxidation of the first silicon layer 18. In the thermal oxidation step, since the region for forming drain junction is covered by the first silicon layer 18 and is remain undoped, the prior issue of growing thick field oxide to damage the erasure performance of the flash memory cell is eliminated.

Figure 4:
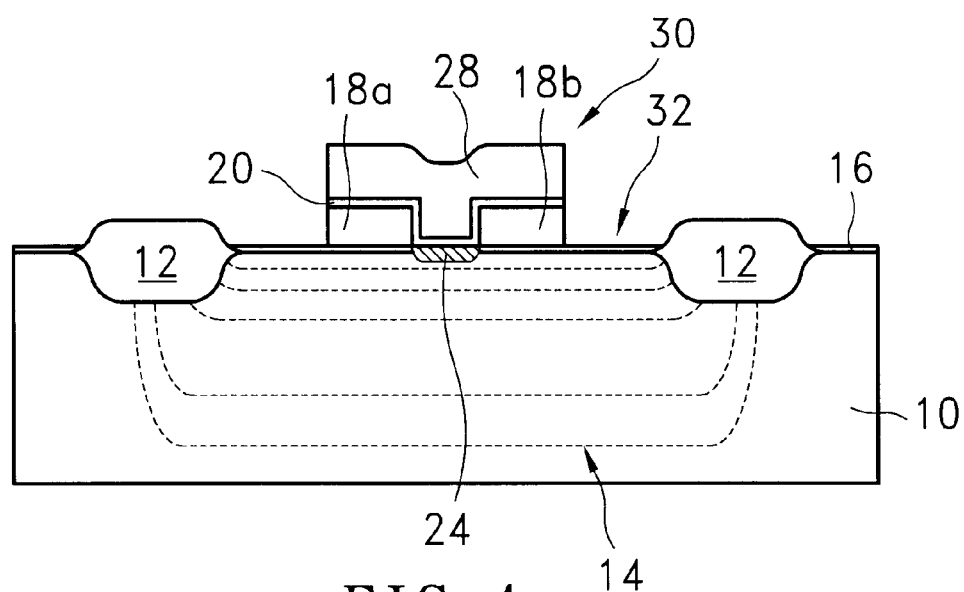
FIG. 4 illustrates a cross sectional view of forming a second silicon layer and patterning the second silicon layer, the dielectric layer, and the first silicon layer to form a gate structure in accordance with the present invention.

Referring to FIG. 4, a second silicon layer 28 is formed on the substrate 10 to fill within the control gate opening 22 and to cover on the dielectric layer 20 over the first silicon layer 18. In the case, the second silicon layer 28 is preferably a polysilicon layer. The polysilicon layer can be formed by chemical vapor deposition (CVD) with a thickness, as an example, between about 2000 to 5000 angstroms. The second silicon layer 28, the dielectric layer 20, and the first silicon layer 18 are then patterned to form a gate structure 30 of the flash memory cell, and to leave a drain opening 32 exposing a portion of the tunnel oxide 16 on the well region 14.

The gate structure 30 as formed preferably includes a control gate of the second silicon layer 28, a floating gate 18a and a select gate 18b of the first silicon layer 18, and inter-gate dielectrics 20 between the control gate and the floating gate 18a/the select gate 18b. In the preferred embodiments, the drain opening 32 is located between the select gate 18b and the isolation regions 12. The dielectric layer 20 and the first silicon layer 18, which occupies most of the well region 14 such as the drain opening 32 before the patterning process, in FIG. 3 are patterned with the same pattern in a self-aligned approach from the overlying second silicon layer 28 in FIG. 4. The patterning step is carried out with conventional lithography process and accompanying etch steps.

Figure 5:
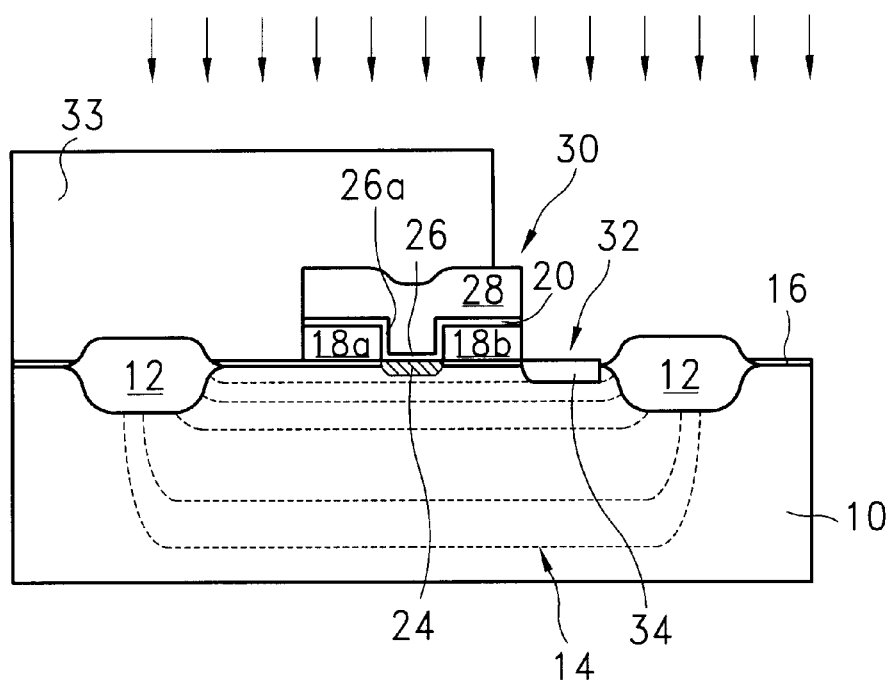
FIG. 5 illustrates a cross sectional view of doping the substrate to form a drain region in the substrate between the gate structure and one of the isolation regions in accordance with the present invention.

Finally, as shown in FIG. 5, the substrate 10 is doped to form a drain region 34 in the substrate 10, between the gate structure 30 and one of the isolation regions 12, namely the isolation region 12 at the right side of the gate structure 30 in the illustrated figure. Having the gate structure 30, the implantation for doping dopants can be performed in a self-aligned approach and thereby providing a much improved process window for the definition of the implantation mask of photoresist 33, as illustrated in the figure.

In the preferred embodiments of the present invention in forming the flash memory cell, the doping step for forming the drain region 34 includes at least two ion implantation steps to form a double diffused drain structure in the substrate 10. In the case, the doping step for forming the drain region 34 includes: a phosphorus implantation at an energy between about 30 to 50 KeV to have a dose between about 1E14 to 5E14 $cm^{-2}$; and an arsenic implantation at an energy between about 40 to 60 KeV to have a dose between about 1E15 to 6E15 $cm^{-2}$.

Figure 6:
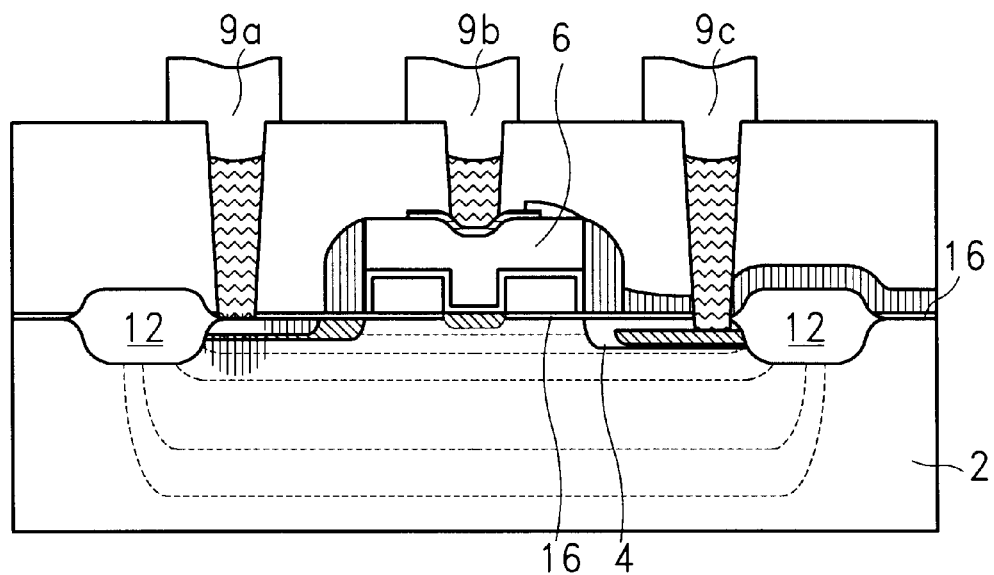
FIG. 6 illustrates a cross sectional view of a flash memory cell provided with the method in accordance with the present invention.

Therefore, a flash memory cell can be formed on a substrate 10 with aforementioned steps. A series of steps are then performed for forming other junction regions and essential connections, resulting the structure as illustrated in FIG. 6. Having the new process flow and pattern definition, the thickness of the tunnel oxide can be kept from growing a thick field oxide. The performance of the flash memory cell is improved with improved erasure efficiency.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming a flash memory cell, said method comprising the steps of:
    providing a semiconductor substrate having isolation regions thereon and having a well region provided between said isolation regions;
    forming a tunnel oxide layer on said well region;
    forming a first silicon layer over said substrate;
    forming a dielectric layer on said first silicon layer;
    removing a portion of said first silicon layer and said dielectric layer to define a control gate opening within said first silicon layer on said well region;
    doping said substrate under said control gate opening to adjust a threshold voltage of said flash memory cell;
    growing a gate oxide layer from said substrate in said control gate opening;
    forming a second silicon layer on said substrate to fill said control gate opening and to cover said dielectric layer;
    patterning said second silicon layer, said dielectric layer, and said first silicon layer to form a gate structure of said flash memory cell, and to leave a drain opening exposing a portion of said tunnel oxide layer on said well region; and
    doping said substrate to form a drain region in said substrate between said gate structure and one of said isolation regions.

2. The method of claim 1, wherein said isolation regions comprise field oxide regions.

3. The method of claim 1, wherein said tunnel oxide layer is thermally grown from said substrate in an oxygen containing ambient, with a thickness between about 30 to 180 angstroms.

4. The method of claim 1, wherein said first silicon layer comprises a polysilicon layer formed by a chemical vapor deposition with a thickness between about 1200 to 3000 angstroms.

5. The method of claim 1, wherein said dielectric layer comprises a tri-layer structure of a first silicon oxide layer, a silicon nitride layer, and a second silicon oxide layer.

6. The method of claim 1, wherein said step of growing said gate oxide is performed by a thermal oxidation to form said gate oxide and a sidewall silicon oxide on sidewalls of said first silicon layer.

7. The method of claim 1, wherein said step of doping said substrate to adjust said threshold voltage is performed with an ion implantation of n-type dopants at an energy between about 20 to 80 KeV to have a dose between about 5E11 to 1E13 atoms/$cm^2$.

8. The method of claim 1, wherein said second silicon layer comprises a polysilicon layer formed by a chemical vapor deposition with a thickness between about 2000 to 5000 angstroms.

9. The method of claim 1, wherein said gate structure includes:
    a control gate of said second silicon layer;
    a floating gate and a select gate of said first silicon layer; and
    inter-gate dielectrics between said control gate and said floating gate and said select gate.

10. The method of claim 9, wherein said drain opening is located between said select gate and one of said isolation regions.

11. The method of claim 1, wherein said second silicon layer, said dielectric layer, and said first silicon layer are patterned with a same pattern in said patterning step.

12. The method of claim 1, wherein said doping step to form said drain region comprises at least two ion implantation steps to form a double diffused drain structure in said substrate.

13. The method of claim 1, wherein said doping step to form said drain region comprises:
    a phosphorus implantation at an energy between about 30 to 50 KeV to have a dose between about 1E14 to 5E14 $cm^{-2}$; and
    an arsenic implantation at an energy between about 40 to 60 KeV to have a dose between about 1E15 to 6E15 $cm^{-2}$.

14. A method for forming a flash memory cell, said method comprising the steps of:
    providing a semiconductor substrate having isolation regions thereon and having a well region provided between said isolation regions;

forming a tunnel oxide layer on said well region;

forming a first silicon layer over said substrate;

forming a dielectric layer on said first silicon layer;

removing a portion of said first silicon layer and said dielectric layer to define a control gate opening within said first silicon layer on said well region;

doping said substrate under said control gate opening to adjust a threshold voltage of said flash memory cell;

growing a gate oxide layer from said substrate in said control gate opening;

forming a second silicon layer on said substrate to fill said control gate opening and to cover said dielectric layer;

patterning said second silicon layer, said dielectric layer, and said first silicon layer to form a gate structure of said flash memory cell, and to leave a drain opening exposing a portion of said tunnel oxide layer on said well region; and doping said substrate to form a drain region in said substrate between said gate structure and one of said isolation regions, said doping step to form said drain region comprising at least two ion implantation steps to form a double diffused drain structure in said substrate.

15. The method of claim 14, wherein said step of doping said substrate to adjust said threshold voltage is performed with an ion implantation of n-type dopants at an energy between about 20 to 80 KeV to have a dose between about 5E11 to 1E13 atoms/cm$^2$.

16. The method of claim 14, wherein said gate structure includes:

a control gate of said second silicon layer;

a floating gate and a select gate of said first silicon layer; and inter-gate dielectrics between said control gate and said floating gate and said select gate.

17. The method of claim 16, wherein said drain opening is located between said select gate and one of said isolation regions.

18. The method of claim 14, wherein said second silicon layer, said dielectric layer, and said first silicon layer are patterned with a same pattern in said patterning step.

19. The method of claim 14, wherein said doping step to form said drain region comprises:

a phosphorus implantation at an energy between about 30 to 50 KeV to have a dose between about 1E14 to 5E14 cm$^{-2}$; and an arsenic implantation at an energy between about 40 to 60 KeV to have a dose between about 1E15 to 6E15 cm$^{-2}$.

* * * * *